United States Patent
Hsu et al.

(10) Patent No.: US 10,475,752 B2
(45) Date of Patent: Nov. 12, 2019

(54) SEMICONDUCTOR PACKAGE STRUCTURE AND METHOD OF MAKING THE SAME

(71) Applicant: Phoenix Pioneer Technology Co., Ltd., Hsinchu County (TW)

(72) Inventors: Shih-Ping Hsu, Hsinchu County (TW); Che-Wei Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/703,022

(22) Filed: Sep. 13, 2017

(65) Prior Publication Data

US 2018/0358304 A1    Dec. 13, 2018

(30) Foreign Application Priority Data

Jun. 9, 2017   (TW) .............................. 106119241 A

(51) Int. Cl.
*H01L 23/00*  (2006.01)
*H01L 23/498*  (2006.01)
(Continued)

(52) U.S. Cl.
CPC .......... *H01L 23/562* (2013.01); *H01L 21/486* (2013.01); *H01L 21/4853* (2013.01); *H01L 21/561* (2013.01); *H01L 21/565* (2013.01); *H01L 21/78* (2013.01); *H01L 23/295* (2013.01); *H01L 23/296* (2013.01); *H01L 23/3114* (2013.01); *H01L 23/367* (2013.01); *H01L 23/3737* (2013.01); *H01L 23/49827* (2013.01); *H01L 23/49838* (2013.01);
(Continued)

(58) Field of Classification Search
CPC . H01L 2224/73204; H01L 2224/16225; H01L 2924/15311; H01L 2924/0665; H01L 2924/01082; H01L 23/5226; H01L 24/10; H01L 23/562
See application file for complete search history.

(56) References Cited

U.S. PATENT DOCUMENTS

| | | | |
|---|---|---|---|
| 2005/0121770 A1* | 6/2005 | Baek ................... | H01L 23/5227 257/698 |
| 2012/0089180 A1* | 4/2012 | Fathi ................... | B41J 2/17559 606/214 |
| 2017/0213956 A1* | 7/2017 | Eissa ..................... | G01R 33/05 |

* cited by examiner

*Primary Examiner* — Zandra V Smith
*Assistant Examiner* — John M Parker
(74) *Attorney, Agent, or Firm* — McClure, Qualey & Rodack, LLP

(57) ABSTRACT

A semiconductor package structure includes a substrate, a chip, bumps, an encapsulation layer and a thermal expansion-matching layer. The chip is located on a top surface of the substrate. The bumps electrically connect the chip and the inner connection pads of the substrate. The encapsulation layer covers the bumps, the chip and the top surface of the substrate. The thermal expansion-matching layer covers the whole top surface of the encapsulation layer, and exposes the side surfaces of the encapsulation layer. The thermal expansion coefficient of the thermal expansion-matching layer is different from that of the encapsulation layer. The side surface of the thermal expansion-matching layer is flush with that of the encapsulation layer. The thermal expansion-matching layer balances the inner stresses caused by the difference of the thermal expansion. Thus, the invention reduces the warpage problem of the formed package.

6 Claims, 10 Drawing Sheets

(51) Int. Cl.
*H01L 23/31* (2006.01)
*H01L 23/373* (2006.01)
*H01L 23/29* (2006.01)
*H01L 21/48* (2006.01)
*H01L 21/56* (2006.01)
*H01L 21/78* (2006.01)
*H01L 23/367* (2006.01)

(52) U.S. Cl.
CPC .......... *H01L 24/16* (2013.01); *H01L 23/3128* (2013.01); *H01L 2224/16225* (2013.01); *H01L 2224/16227* (2013.01); *H01L 2224/97* (2013.01); *H01L 2924/15174* (2013.01); *H01L 2924/15311* (2013.01); *H01L 2924/181* (2013.01); *H01L 2924/3511* (2013.01)

SEMICONDUCTOR PACKAGE STRUCTURE AND METHOD OF MAKING THE SAME

CROSS REFERENCE TO RELATED APPLICATIONS

This Non-provisional application claims priority under 35 U.S.C. § 119(a) on Patent Application No. 106119241 filed in Republic of China on Jun. 9, 2017, the entire contents of which are hereby incorporated by reference.

BACKGROUND

1. Technical Field

This invention relates to a semiconductor package structure and a manufacturing method thereof, in particular, to a semiconductor package structure and a manufacturing method that utilize the thermal expansion-matching layer to eliminate a warpage problem.

2. Description of Related Art

Semiconductor package provides protection against impact and corrosion, holds the contact pins or leads which are used to connect from external circuits to the device, and dissipates heat produced in the device. The substrates serve as the connection between integrated circuit (IC) chips and the printed circuit board (PCB) through a conductive network of traces and holes. The substrates support critical functions including circuit support and protection, heat dissipation, and signal and power distribution. With the continued development of electronics industries, there has been rapidly increasing consumer demand for devices that are multi-functional, more convenient, and smaller. This demand has driven the need for increased IC density. Increased input-output (I/O) pin count and increased demands for IC density have led to the development of chip packages.

Wire bonding and flip-chip assembly are the principal methods for interconnecting ICs. Wire bonding is a method in which wires are used to interconnect the electric pads of the chip to external circuitry of the substrate. Flip chip is a method for interconnecting the electric pads of the chip to external circuitry of the substrate with solder bumps that have been deposited onto the chip pads.

FIG. 1 is a schematic diagram illustrating a prior art flip chip package structure 10. The flip chip package structure 10 includes the chip 12, the substrate 14, the solder balls 16 and the encapsulation layer 18. The chip 12 is disposed on the substrate 14. The chip 12 includes electric pads 20. The substrate 14 includes a conductive layer 30. The chip 12 is electrically connected to the conductive layer 30 of the substrate 14 through its own electric pads 20 and the solder balls 16. Accordingly, the chip 12 is electrically connected to pads located on the bottom surface of the flip chip package structure 10, and the bottom pads are output/input leads of the flip chip package structure 10. The encapsulation layer 18 provides physical protection, electrical protection, contamination isolation, and water vapor isolation to the flip chip package structure 10. Thereafter, the flip chip package structure 10 may be further soldered to a printed circuit board (not shown).

The thermal expansion coefficient of the chip 12 is about 2.6 parts per million/Celsius (ppm/° C.), and the thermal expansion coefficient of the encapsulation layer 18 is about 10 ppm/° C. to 50 ppm/° C. The dis-match in coefficient of thermal expansion (CTE dis-match) amount the chip 12, the substrate 14 and the encapsulation layer 18 causes internal stress in the flip chip package structure 10, after the high-low temperature cycle test and the high temperature rewinding cooling test. As shown in FIGS. 2A and 2B, the internal stress leads to warpage problem of the substrate 14. The warpage of the flip chip package structure 10 causes poor contact between the chip 12 and the solder ball 16, so the printed circuit boar cannot be electrically connected with the flip chip package structure 10 in the following processes. The thermal stress bending the flip chip package structure 10 may lead to breakage of the solder joints or rupture of chips 12. As a result, the reliability of the package structure is reduced. With the development on ball grid array package (BGA) technology and thinning package, it is important to solve the warpage problem.

SUMMARY OF THE INVENTION

It is therefore an object of the present invention to provide a semiconductor package structure having a thermal expansion matching layer and a method of manufacturing the same, which avoids the problem of warpage caused by the CTE dis-match amount the chip, the substrate and the encapsulation layer. In addition, the manufacturing method of the present invention is carried out in a panel type from a substrate to a wafer package, thereby the production efficiency is improved and the process time is decreased.

To achieve the above, the present invention is to provide a semiconductor package structure including a substrate, a chip, a plurality of bumps, an encapsulation layer and a thermal expansion-matching layer. The substrate has a top surface and a bottom surface. The substrate includes a plurality of inner connection pads and a plurality of outer connection pads. The inner connection pads and the outer connection pads are individually disposed on the top surface and the bottom surface of the substrate. The chip is disposed on the top surface of the substrate. The bumps are electrically connecting the chip and the inner connection pads of the substrate. The encapsulation layer covers the bumps, the chip and the top surface of the substrate. The encapsulation layer has a top surface and at least one side surface. The thermal expansion-matching layer covers the whole top surface of the encapsulation layer, and exposes the side surface of the encapsulation layer. The thermal expansion coefficient of the thermal expansion-matching layer is different from the thermal expansion coefficient of the encapsulation layer, and the side surface of the thermal expansion-matching layer is flush with the side surface of the encapsulation layer.

To achieve the above, the present invention is to provide a method of manufacturing a semiconductor package structure. First, a panel type substrate is provided. The panel type substrate has a top surface and a bottom surface. The panel type substrate includes a plurality of inner connection pads and a plurality of outer connection pads. The inner connection pads and the outer connection pads are individually disposed on the top surface and the bottom surface of the panel type substrate. Subsequently, chips are provided. Next, bumps are formed on the chips. The chips are disposed on the top surface of the panel type substrate. The bumps are electrically connected to the chips and the inner connection pads of the panel type substrate. Thereafter, an encapsulation layer is formed to cover the bumps, the chips and the top surface of the panel type substrate. Next, a thermal expansion-matching layer is formed to cover the whole top surface of the encapsulation layer. The thermal expansion coefficient of the thermal expansion-matching layer is different from the thermal expansion coefficient of the encapsulation layer. Thereafter, a dicing process is performed to cut the panel type substrate, the thermal expansion-matching layer and the encapsulation layer. The encapsulation layer has a top surface and at least one side surface. The side surface of the thermal expansion-matching layer is flush with the side surface of the encapsulation layer.

In one embodiment of the present invention, the chip has a back surface and at least one side surface, the encapsulation layer covers the bumps, the side surface of the chip and the top surface of the substrate, and the thermal expansion-matching layer covers the whole top surface of the encapsulation layer and the whole back surface of the chip.

In another embodiment of the present invention, the encapsulation layer covers the bumps, the top surface of the substrate and the whole chip.

Additionally, the thermal expansion-matching layer of the present invention balances the said CTE dis-match, therefore avoids the warpage problem and improves the yield of the product. In addition, the manufacturing method of the present invention is carried out in a panel type from a substrate to a wafer package, thereby the production efficiency is improved and the process time is decreased.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 3A:
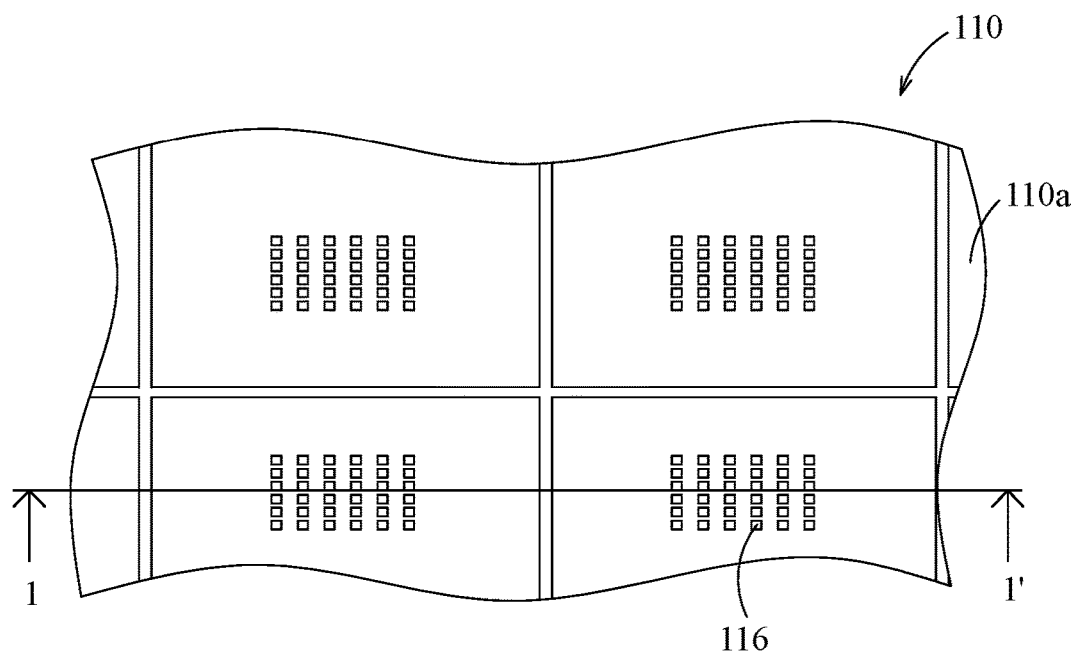
FIG. 3A, FIG. 4A, FIG. 5A and FIG. 7A are top views illustrating the method of manufacturing a semiconductor package structure according to the first embodiment of the present invention.
Figure 3B:
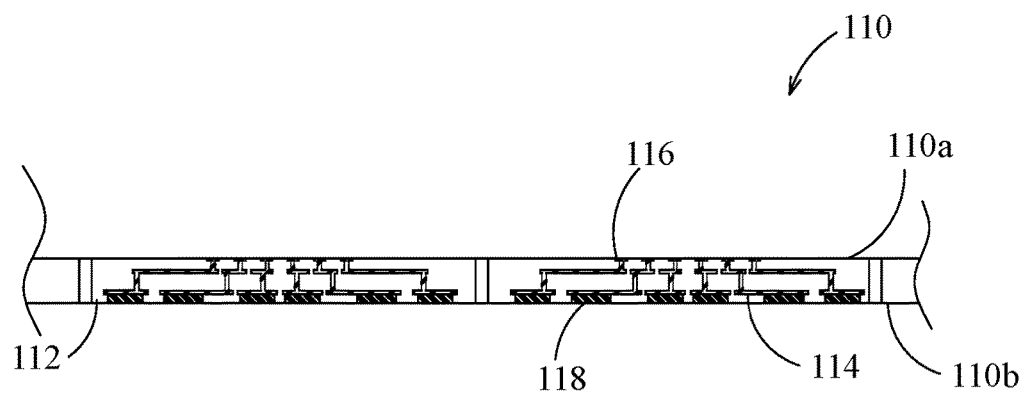
FIG. 3B, FIG. 4B, FIG. 5B, FIG. 6 and FIG. 7B are schematic diagrams illustrating the structures of the manufacturing method along the cutting line 1-1' according to the first embodiment.

FIG. 3A, FIG. 4A, FIG. 5A and FIG. 7A are top views illustrating the method of manufacturing a semiconductor package structure 100 according to the first embodiment of the present invention. FIG. 3B, FIG. 4B, FIG. 5B, FIG. 6 and FIG. 7B are schematic diagrams illustrating the structures 100 of the manufacturing method along the cutting line 1-1' according to the first embodiment. As shown in FIG. 3A and FIG. 3B, a panel type substrate 110 is first provided. The panel type substrate 110 has a top surface 110a and a bottom surface 110b. The top surface 110a is opposite to the top surface 110a. The panel type substrate 110 has a substrate 112, a plurality of inner connections 114, a plurality of the inner connection pads 116, a plurality of outer connection pads 118. The inner connection pads 116 are disposed on the top surface 110a of the panel type substrate 110, and the outer connection pads 118 are disposed on the bottom surface 110b of the panel type substrate 110. The inner connections 114 are electrically connected to the inner connection pads 116 and the outer connection pads 118. The panel type substrate 110 may have one or more number layer(s). The panel type substrate 110 can be single-layer structure or multiple-layer structure.

Figure 4A:
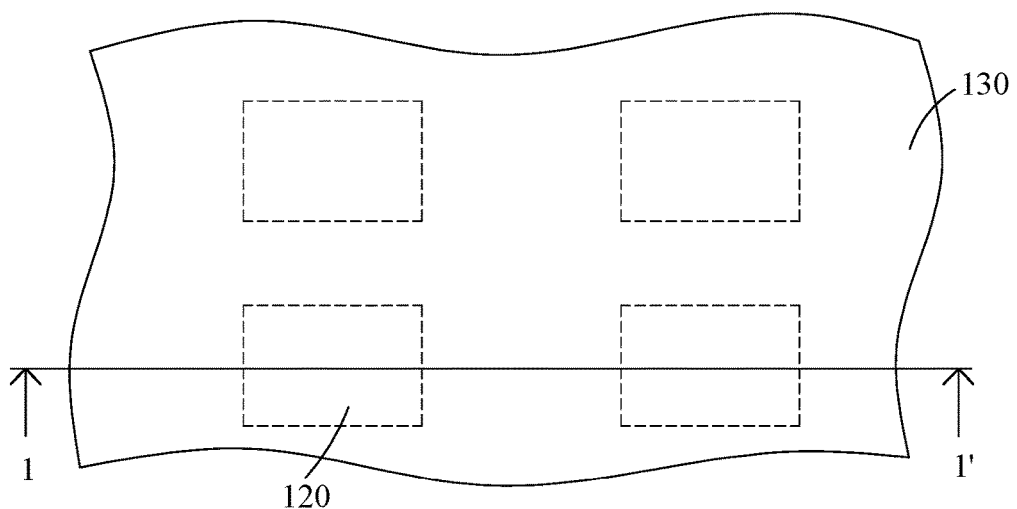
Figure 4B:
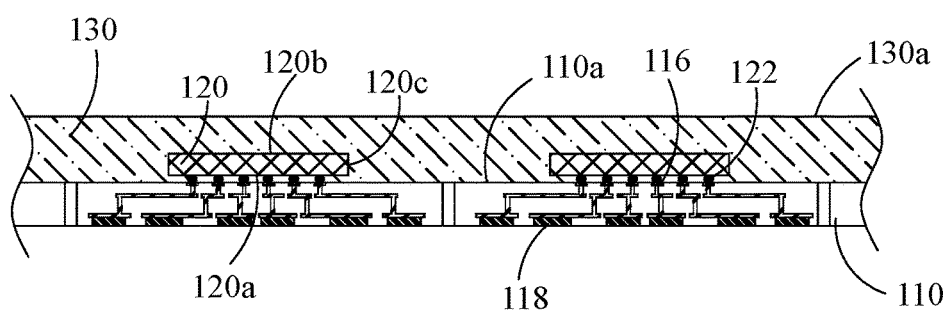

As shown in FIG. 4A and FIG. 4B, a die bond process and a molding process are subsequently performed. In detail, chips 120 are provided. Each of the chips 120 has an active surface 120a, a back surface 120b and a side surface 120c. Each chip 120 has a plurality of electrical pads the active surfaces 120a (not shown in the figures). Next, bumps 122 are formed on electrical pads of the chips 120. The bumps 122 are electrically conduct elements, such as solder balls. Thereafter, the chips 120 are disposed on the panel type substrate 110, with the active surface 120a of the chips 120 turned down toward the panel type substrate 110. Accordingly, the bumps 122 electrically connect the electrical pads of the chips 120 and the inner connection pads 116 of the panel type substrate 110. The chips 120 may be semiconductor chips, integrated circuit the chips, light emitting diode chips or any other chips. In other embodiments, an adhesive layer (not shown in the figures) may be formed between the chips 120 and the panel type substrate 110, to adhere the chips 120 on the panel type substrate 110. After that, an encapsulation layer 130 is formed on the panel type substrate 110 to cover the bumps 122, the whole chips 120 and the whole top surface 110a of the panel type substrate 110. The encapsulation layer 130 has a top surface 130a.

The processes of forming the encapsulation layer 130 includes steps of providing an encapsulating material into a mold (not shown in the figures), heating the encapsulating material, injecting the flowing encapsulating material through a runner and a gate into the cavity, in which the chips 120 and the panel type substrate 110 are disposed, molding, and performing a baking process to curing the encapsulation layer 130. The encapsulation layer 130 includes a first epoxy molding compound (EMC, also called as solid molding material). The first EMC may include silicone, epoxy, a hardener and a flame retardant.

In the embodiment, the first EMC is one of the high filler content dielectric material, which is based on epoxy resin as the main material. In epoxy molding compound, the epoxy resin is about 8 wt. % to 12 wt. % and the filler is about 70 wt. % to 90 wt. %. The filler may include silica and alumina to increase the mechanical strength, reduce the linear thermal expansion coefficient, increase heat conduction, increase water resistance and reduce the effectiveness of rubber overflow.

Figure 5A:
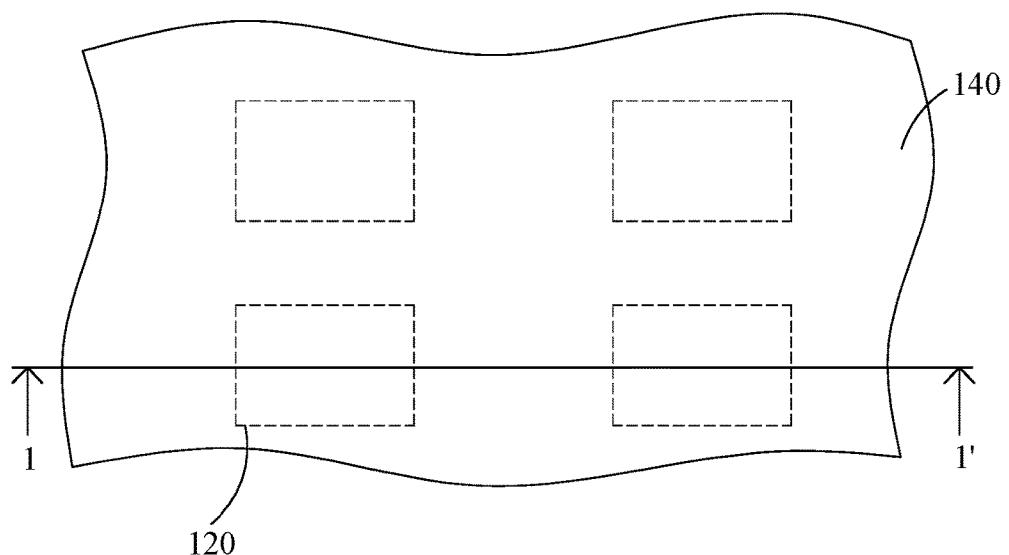
Figure 5B:
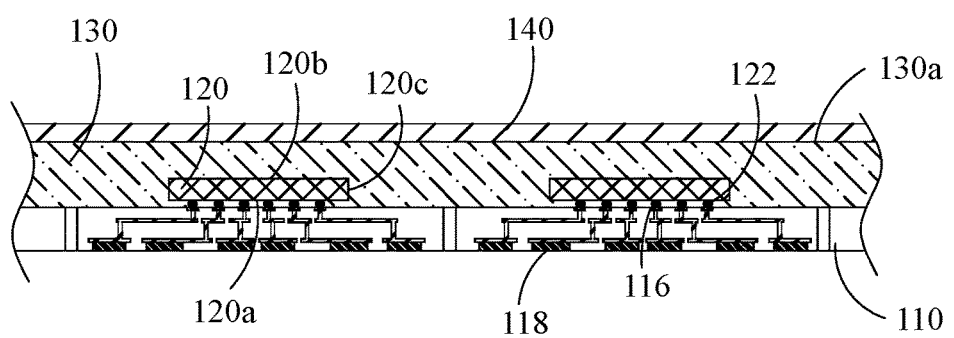

As shown in FIG. 5A and FIG. 5B, a thermal expansion-matching layer 140 is next formed to cover the whole top surface 130a of the encapsulation layer 130. The thermal expansion coefficient of the thermal expansion-matching layer 140 is different form the thermal expansion coefficient of the encapsulation layer 130.

Figure 1:
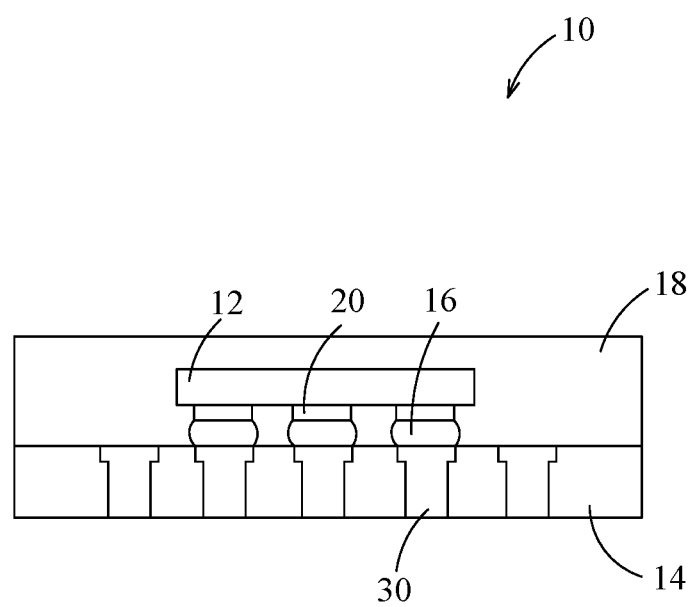
FIG. 1 is a schematic diagram illustrating a prior art flip chip package structure.
Figure 2A:
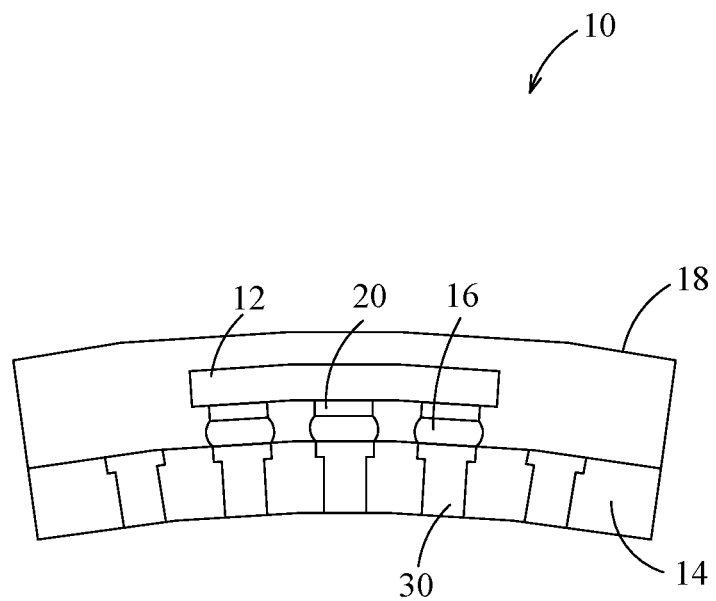
FIG. 2A and FIG. 2B are schematic diagrams illustrating the warpage of prior art flip chip package structure.
Figure 2B:
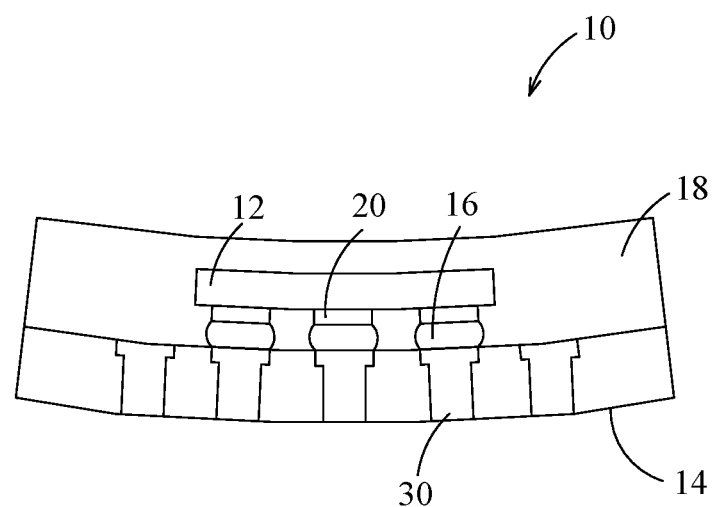

If the package structure bends down without the thermal expansion-matching layer 140 (the encapsulation layer 130 bends toward the panel type substrate 110, as shown in FIG. 2A), a thermal expansion-matching layer 140 having a thermal expansion coefficient bigger than that of the encapsulation layer 130 is adopted in the present invention to balance the internal stress. On the contrary, if the package structure bends up without the thermal expansion-matching layer 140 (the panel type substrate 110 bends toward the encapsulation layer 130, as shown in FIG. 2B), a thermal expansion-matching layer 140 having a thermal expansion coefficient smaller than that of the encapsulation layer 130 is adopted in the present invention to balance the internal stress.

The thermal expansion-matching layer 140 may include a second EMC, polyimide, or includes just epoxy. The second EMC may include silicone, epoxy, a hardener, a flame retardant, and/or any other additives, such as catalyst, accelerator, release agent, stress moderator and/or colorant.

The second EMC contains about 68~79% silicone, 10~15% epoxy, 10~15% hardener and 1% flame retardant. The composition ratio of the first EMC is different from the composition ratio of the second EMC, so the thermal expansion coefficient of the first EMC is different from the thermal expansion coefficient of the second EMC. For example, since silicone has a smaller thermal expansion coefficient than other ingredients, the EMC containing more silicone may have a smaller thermal expansion coefficient. The epoxy of the thermal expansion-matching layer 140 may be cresol varnish type epoxy resin. The thermal expansion coefficient of polyimide is about 28 ppm/° C.

The processes of forming the thermal expansion-matching layer 140 may include performing a lamination process or a coating process, performing a baking process to form the encapsulation, and cooling package structure to room temperature.

Figure 6:
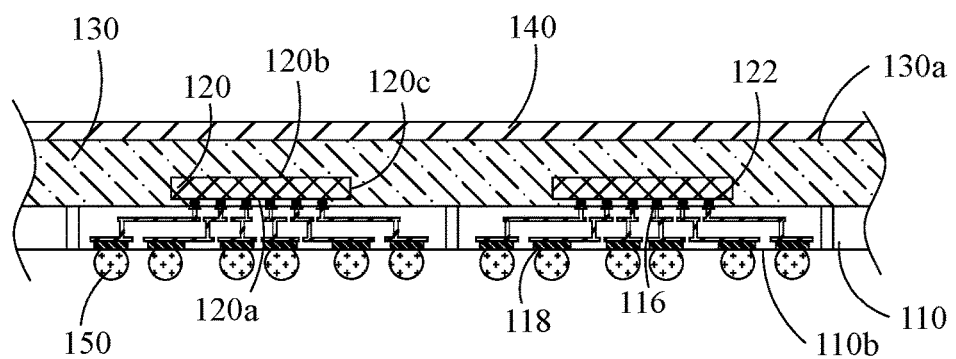

As shown in FIG. 6, electrical connection elements 150 are selectively formed on the bottom surface 110b of the panel type substrate 110. The electrical connection elements 150 are electrically connected to the outer connection pads 118, so that each semiconductor package structure 100 can be connected to PCB in the following process (not shown in the figures). The electrical connection elements 150 may be solder balls, so that the formed semiconductor package structure 100 is a ball grid array (BGA) structure. The solder balls of BGA can fix and electrically connect the chips 120 to PCB. In comparison with dual in-line package or quad flat package, a BGA structure can provide more interconnection pins. The leads of BGA are also on average shorter than with a perimeter-only type, leading to better performance at high speeds. In other embodiments, the electrical connection elements 150 may be conductive bumps of gold or copper.

In other embodiments of the present invention, the outer connection pads 118 of the panel type substrate 110 are lands, so the formed semiconductor package structure 100 is a land grid array (LGA) structure. The LGA is a type of surface-mount packaging for ICs that is notable for having the pins on the socket rather than the integrated circuit. An LGA can be electrically connected to a PCB either by the use of a socket or by soldering directly to the board. Unlike pin grid arrays, the land grid array packages setup provides higher pin densities and less broken pins.

Figure 7A:
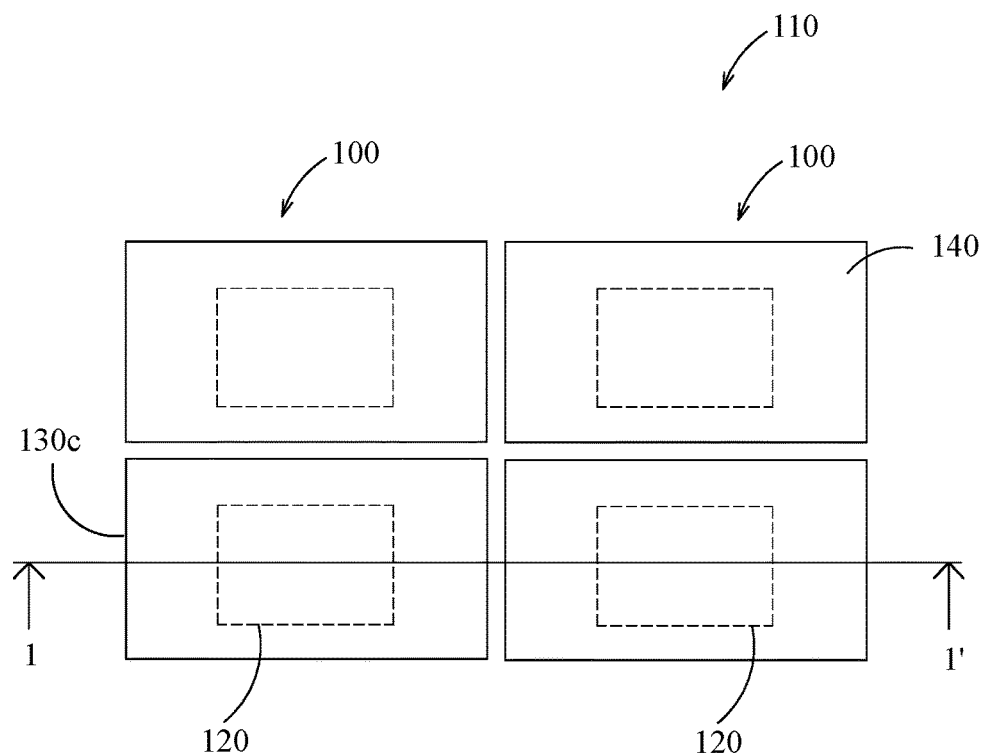
Figure 7B:
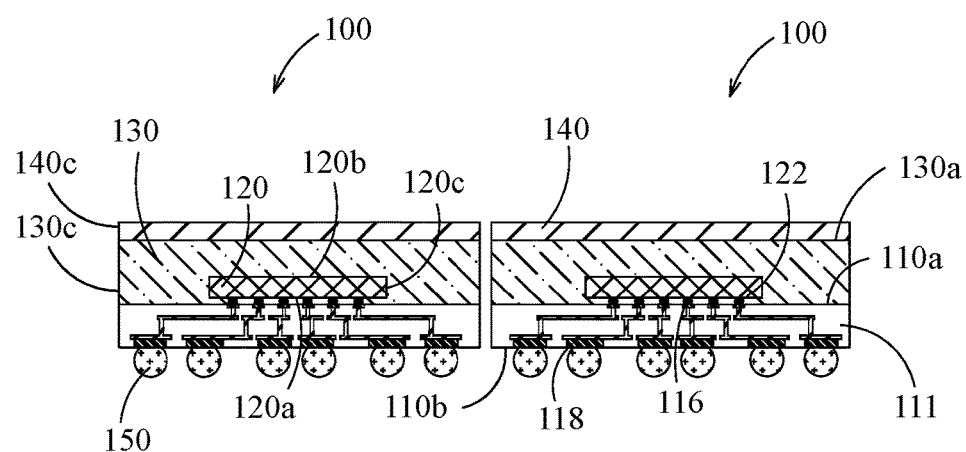

As shown in FIG. 7A and FIG. 7B, a dicing process is performed to cut the panel type substrate 110, the thermal expansion-matching layer 140 and the encapsulation layer 130, so that the chips 120 are separated from each other. Accordingly, the side surface 140c of the thermal expansion-matching layer 140 is flush with the side surface 130c of the encapsulation layer 130, and a plurality of the semiconductor package structure 100 are manufactured in batch. The panel type substrate 110 is diced into a plurality of substrates 111. Each substrate 111 supports one or more chips 120. The fan-out of a logic gate output is the number of gate inputs it can drive. The maximum fan-out of an output measures its load-driving capability: it is the greatest number of inputs of gates of the same type to which the output can be safely connected to the PCB.

The semiconductor package structures 100 made by the method of the present invention are shown in FIG. 7B, each semiconductor package structure 100 includes a substrate 111, a chip 120, a plurality of the bumps 122, an encapsulation layer 130 and a thermal expansion-matching layer 140. Each substrate 111 has a top surface 110a and a bottom surface 110b. Each substrate 111 has a plurality of inner connection pads 116 disposed on the top surface 110a, and a plurality of the outer connection pads 118 disposed on the bottom surface 110b. Each chip 120 is disposed on the top surface 110a of the corresponding substrate 111. The bumps 122 electrically connect the chips 120 to the inner connection pads 116 of the substrates 111. Each encapsulation layer 130 covers the bumps 122, the whole chip 120 and the top surface 110a of the corresponding substrate 111. Each encapsulation layer 130 has a top surface 130a and a side surface 130c. Each thermal expansion-matching layer 140 covers the whole top surface 130a of the corresponding encapsulation layer 130, and exposes the side surface 130c of the encapsulation layer 130. The thermal expansion coefficient the thermal expansion-matching layers 140 is different from the thermal expansion coefficient of the encapsulation layers 130. The side surface 140c of the thermal expansion-matching layer 140 is flush with the side surface 130c of the encapsulation layer 130. Since the thermal expansion-matching layer 140 balances the CTE dis-match, the present invention avoids the warpage problem.

Figure 8A:
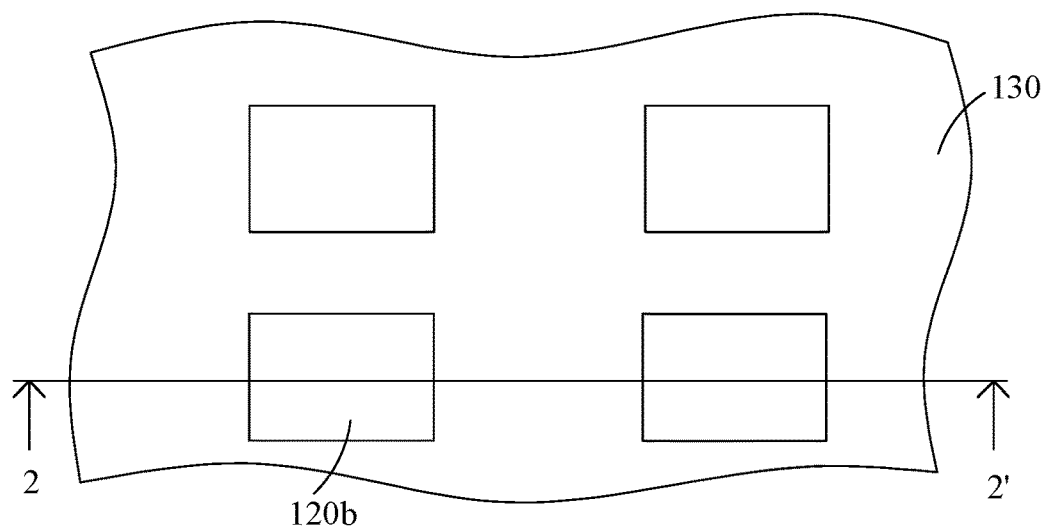
FIG. 8A and FIG. 9A are top views illustrating the method of manufacturing a semiconductor package structure according to the second embodiment of the present invention.
Figure 8B:
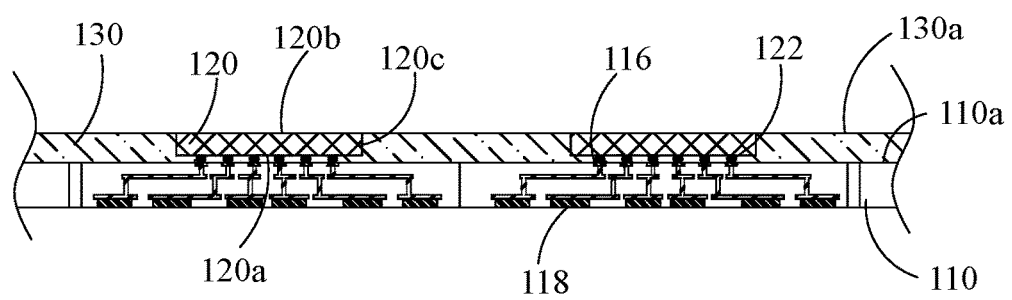
FIG. 8B and FIG. 9B are schematic diagrams illustrating the structures of the manufacturing method along the cutting line 2-2' according to the second embodiment.
Figure 9A:
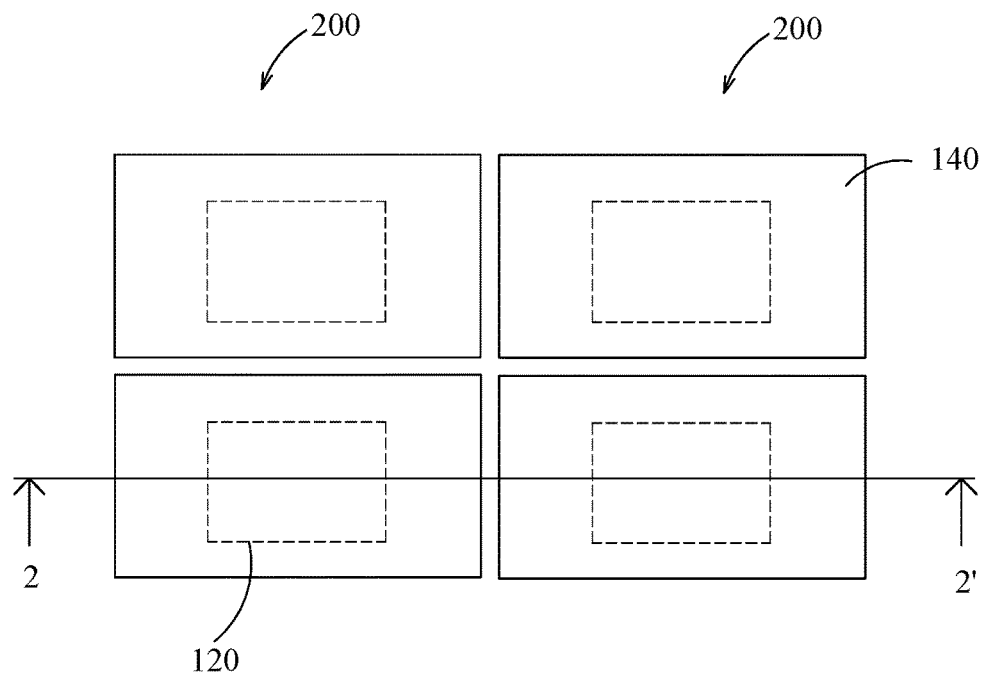
Figure 9B:
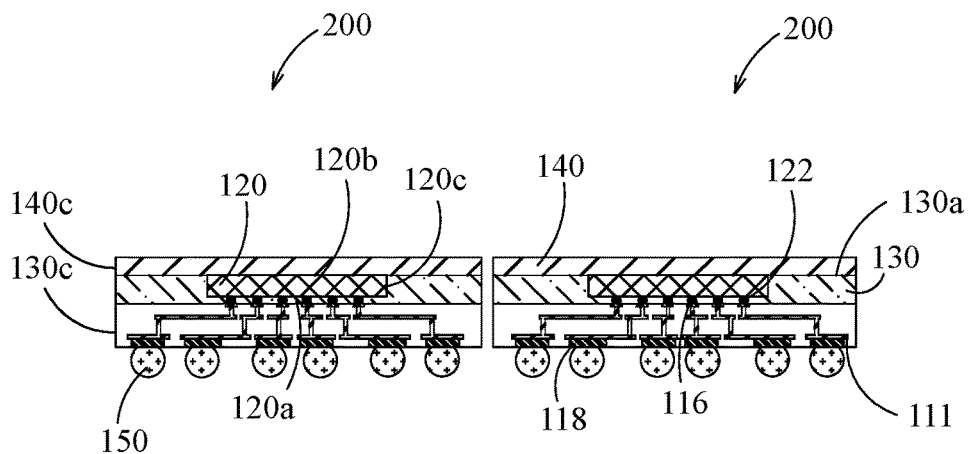

FIG. 8A and FIG. 9A are top views illustrating the method of manufacturing a semiconductor package structure 200 according to the second embodiment of the present invention. FIG. 8B and FIG. 9B are schematic diagrams illustrating the semiconductor package structures 200 of the manufacturing method along the cutting line 2-2' according to the second embodiment. The difference between the first embodiment and the second embodiment is that the second embodiment includes a step of thinning the encapsulation layer 130, before the step of forming the thermal expansion-matching layer 140.

As shown in FIG. 8A and FIG. 8B, the second embodiment includes a step of thinning the encapsulation layer 130 by performing a chemical mechanical polishing (CMP) process or a grinding process, after the step of forming the encapsulation layer 130, and before the step of forming the thermal expansion-matching layer 140. The step of thinning the encapsulation layer 130 can expose the back surface 120b of the chips 120. In such a case, the encapsulation layer 130 covers and contacts the bumps 122, the side surface 120c of the chips 120 and the top surface 110a of the panel type substrate 110. In other embodiments, the step of thinning the encapsulation layer 130 may not expose the back surface 120b of the chips 120, and is performed for reduce the thinness of the encapsulation layer 130.

As shown in FIG. 9A and FIG. 9B, the thermal expansion-matching layer 140 is next formed, the electrical connection elements 150 are selectively formed, and a dicing process is thereafter performed. The thermal expansion-matching layer 140 of the second embodiment covers and contacts the whole top surface 130a of the encapsulation layer 130 and the whole back surface 120b of the chips 120.

Thinning of the encapsulation layer 130 not only provides a thinner semiconductor package structure 200, but also reduces the bending stress of the encapsulation layer 130. The thermal expansion-matching layer 140 still provides protection against impact, corrosion, electrical interference, pollution and moisture, and adjusts thermal stress in the semiconductor package structure 200.

Figure 10:
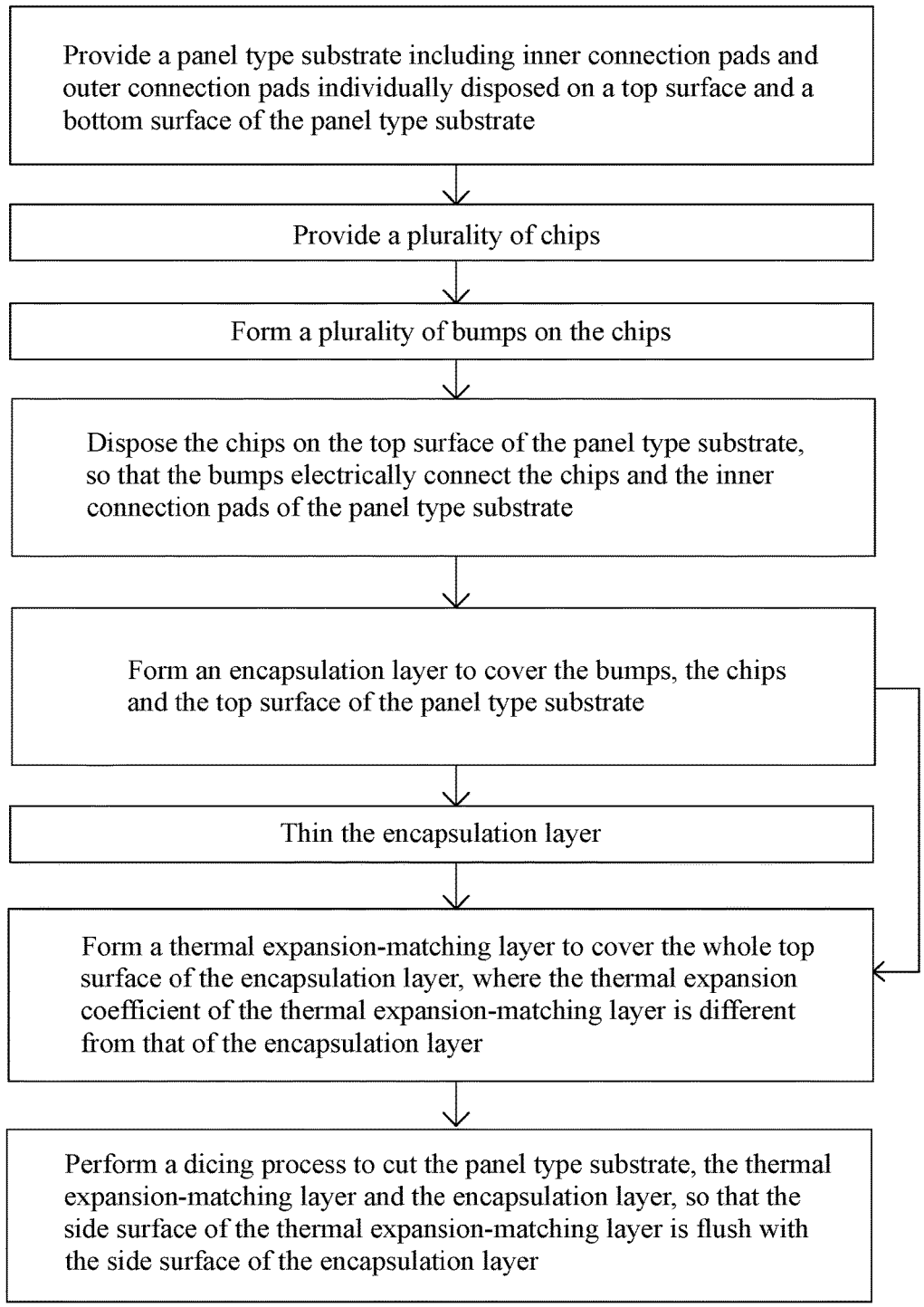
FIG. 10 is a flow chart showing a method of manufacturing a semiconductor package structure according to the present invention.

FIG. 10 is a flow chart showing the method of manufacturing a semiconductor package structure according to the present invention. Summed up the above embodiments, the method of the present invention includes providing a panel type substrate 110 first. The panel type substrate 110 includes inner connection pads 116 and outer connection pads 118 individually disposed on a top surface 110a and a bottom surface 110b of the panel type substrate 110. Subsequently, chips 120 are provided. Next, bumps 122 are formed on the chips 120. The chips 120 are disposed on the top surface 110a of the panel type substrate 110. The bumps 122 are electrically connected to the chips 120 and the inner connection pads 116 of the panel type substrate 110. Thereafter, an encapsulation layer 130 is formed to cover the bumps 122, the chips 120 and the top surface 110a of the panel type substrate 110.

Thereafter, the encapsulation layer 130 is optionally thinned. Next, a thermal expansion-matching layer 140 is formed to cover the whole top surface 130a of the encapsulation layer 130. The thermal expansion coefficient of the thermal expansion-matching layer 140 is different from the thermal expansion coefficient of the encapsulation layer 130. Thereafter, a dicing process is performed to cut the panel type substrate 110, the thermal expansion-matching layer 140 and the encapsulation layer 130. The encapsulation layer 130 has a top surface 130a and at least one side surface 130c. The side surface 140c of the thermal expansion-matching layer 140 is flush with the side surface 130c of the encapsulation layer 130.

In summary, the thermal expansion-matching layer of the present invention balances the said CTE dis-match, therefore avoids the warpage problem and improves the yield of the product. In addition, the manufacturing method of the present invention is carried out in a panel type from a substrate to a wafer package, thereby the production efficiency is improved and the process time is decreased.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A semiconductor package structure, comprising:
a substrate, having a top surface and a bottom surface, the substrate comprising a plurality of inner connection pads and a plurality of outer connection pads, the inner connection pads and the outer connection pads being individually disposed on the top surface and the bottom surface of the substrate;
a chip, disposed on the top surface of the substrate;
a plurality of bumps, electrically connected to the chip and the inner connection pads of the substrate;
an encapsulation layer, covering the bumps, the chip and the top surface of the substrate, the encapsulation layer having a top surface and at least one side surface; and
a thermal expansion-matching layer, covering the whole top surface of the encapsulation layer, and exposing the at least one side surface of the encapsulation layer, wherein the thermal expansion coefficient of the thermal expansion-matching layer is different from the thermal expansion coefficient of the encapsulation layer, wherein the encapsulation layer comprises a first epoxy molding compound (EMC), the thermal expansion-matching layer comprises a second EMC, the first and the second EMCs both comprise silicone, epoxy, hardener and flame retardant, and a composition ratio of the first EMC is different from a composition ratio of the second EMC.

2. The semiconductor package structure of claim 1, wherein the first EMC is a high filler content dielectric material, which the filler content is about 70 wt. % to 90 wt. %.

3. The semiconductor package structure of claim 1, wherein the second EMC contains about 68~79% silicone, 10~15% epoxy, 10~15% hardener and 1% flame retardant.

4. The semiconductor package structure defined in claim 1, wherein the thermal expansion-matching layer comprises epoxy or polyimide.

5. The semiconductor package structure defined in claim 1, further comprises a plurality of solder balls, which are disposed on the bottom surface of the substrate, and electrically connected to the outer connection pads.

6. The semiconductor package structure defined in claim 1, wherein the outer connection pads of the substrate are a plurality of lands.

* * * * *